US008027210B2

(12) United States Patent
Ku et al.

(10) Patent No.: US 8,027,210 B2
(45) Date of Patent: Sep. 27, 2011

(54) DATA INPUT APPARATUS WITH IMPROVED SETUP/HOLD WINDOW

(75) Inventors: Kie Bong Ku, Chungcheongbuk-do (KR); Kwang Jun Cho, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 345 days.

(21) Appl. No.: 12/199,046

(22) Filed: Aug. 27, 2008

(65) Prior Publication Data

US 2009/0161455 A1    Jun. 25, 2009

(30) Foreign Application Priority Data

Dec. 21, 2007    (KR) .................. 10-2007-0135576

(51) Int. Cl.
*G11C 7/00* (2006.01)

(52) U.S. Cl. ............... 365/193; 365/194; 365/233.1

(58) Field of Classification Search .......... 365/193, 365/194, 191, 189.07, 201
See application file for complete search history.

(56) References Cited

FOREIGN PATENT DOCUMENTS

KR    1020070107976 A    11/2007

*Primary Examiner* — Hoai V Ho
*Assistant Examiner* — Kretelia Graham
(74) *Attorney, Agent, or Firm* — Ladas & Parry LLP

(57) ABSTRACT

In the data input apparatus, a data delay unit outputs data input from outside the data input apparatice. The data delay unit varies the degree of delay in response to a test mode signal. A data alignment signal generating unit receives a first signal synchronized with an external clock signal and a second signal synchronized with a data strobe signal, and the data alignment signal generating unit outputs one of the first signal and the second signal as a data alignment signal in response to the test mode signal. A data alignment unit is synchronized with the data alignment signal to align the data delayed in the data delay unit. The data input apparatus improves the setup/hold window when a semiconductor memory device is in the test mode.

18 Claims, 10 Drawing Sheets

DATA INPUT APPARATUS WITH IMPROVED SETUP/HOLD WINDOW

CROSS-REFERENCE TO RELATED APPLICATIONS

The present application claims priority to Korean patent application number 10-2007-0135576 filed on Dec. 21, 2007 which is incorporated herein by reference in its entirety.

BACKGROUND OF THE INVENTION

The present invention relates to a semiconductor memory device, and more particularly, to a data input apparatus in a semiconductor memory device.

Semiconductor memory devices are being continuously improved in order to increase the degree of integration and improve the operation speed. In order to improve operation speed, a synchronous memory device that can be operated in synchronization with a clock provided externally from a memory chip has been proposed.

One such proposed synchronous memory device is a single data rate (SDR) synchronous memory device that is synchronized with a rising edge of the clock provided from the external of the memory device to input and output a single data over a single period. However, the SDR synchronous memory device is insufficient when a system requires high speed operation. As a result, a double data rate (DDR) synchronous memory device that is synchronized with the rising edge and falling edge of the clock allowing two data to be processed in a single clock period has been proposed.

FIG. 1 is a block view schematically showing blocks associated with a write operation of the conventional DDR synchronous memory device.

Referring to FIG. 1, the semiconductor memory device comprises: a data strobe buffer 10 receiving and buffering data strobe signals DQS and DQSB; a data strobe driver 12 driving a signal outputted from the data strobe buffer 10 to output a rising strobe pulse DQSRP and a falling strobe pulse DQSFP; a data input buffer 14 buffering data DQ inputted through a data input/output pad, a data delay unit 16 delaying an output signal of the data input buffer for a predetermined time and outputting an output signal; and a data alignment unit 18 latching input data DIN outputted from the data delay unit in synchronization with the data strobe signal to align them.

The rising data strobe pulse DQSRP is a signal synchronized with the rising edge of the data strobe signal DQS, and the falling data strobe pulse DQSFP is a signal synchronized with the falling edge of the data strobe signal DQS.

The delay unit 16 delays the buffered data by a predetermined time and allocates the input data DIN to the data alignment unit 18.

The data alignment unit 18 aligns the input data DIN by synchronizing the input data DIN with the rising data strobe pulse DQSRP and the falling data strobe pulse DQSFP. The data aligned by the data alignment unit 18 is transferred to a memory cell region via a global input/output line in response to a pulse applied from the external.

FIG. 2 is a timing diagram for explaining the operation of FIG. 1.

FIG. 2 confirms that the rising data strobe pulse DQSRP is synchronized with the rising edge of the data strobe signal DQS and the falling data strobe pulse DQSFP is synchronized with the falling edge of the data strobe signal DQS.

As FIG. 2 clearly shows, the data DIN inputted to the data alignment unit 18 is delayed through the delay unit 16 to secure a setup/hold time.

FIG. 3 shows a prior art method of turning-off the data strobe buffer upon entering into a test mode and aligning the data using the output of a clock buffer.

Referring to FIG. 3, the semiconductor device comprises a data strobe buffer 30, a data strobe driver 32, a data input buffer 34, a data delay unit 36, a data alignment unit 38, and a clock buffer 40.

The clock buffer 40 buffers an external clock signal pair CLK and CLKB that is inputted from outside to output an internal clock signal BCK.

The data strobe buffer 30 and the data strobe driver 32 have a similar configuration to the buffer 10 and the driver 12 as shown in FIG. 1; however, there is a difference, in that the data strobe buffer 30 and the data strobe driver 32 are operated in response to a test mode signal TM. That is, the data strobe buffer 30 and the data strobe driver 32 are turned-off upon entering into a test mode, in which the test mode signal TM is enabled.

When the test mode signal TM is enabled, the data strobe driver is synchronized with the internal clock signal BCK outputted from the clock buffer in order to output the data strobe pulse DQSRP and the falling data strobe pulse DQSFP. In other words, the rising data strobe pulse DQSRP is outputted in synchronization with the rising edge of the internal clock signal BCK, and the falling data strobe pulse DQSFP is outputted in synchronization with the falling edge of the internal clock signal BCK.

The data delay unit 36 and the data alignment unit 38 are operated identically to the data delay unit 16 and the data alignment unit 18 shown in FIG. 1; and therefore, a detailed description will be omitted.

However, in the prior art shown in FIG. 3, it is difficult to secure the data setup/hold time upon entering into the test mode, since the pulse signals DQSRP and DQSFP, which are used as the data alignment signal of the data alignment unit 38, are synchronized by means of the internal clock signal BCK as shown in FIG. 3. The reason is that the degree delayed by means of the delay unit 36 is determined based on the data strobe buffer 30, although a timing of the internal clock signal BCK, which is buffered by means of the clock buffer, is slower than that of the signal buffered by means of the data strobe buffer. In particular, the clock buffer 40 is distributed at the center of the chip, the data strobe buffer 30 and the data strobe driver 32 are distributed at the left of the chip, and the data block (DQ pad, data input buffer, data delay unit, data alignment unit) is distributed at the left-center of the chip. The output signal BCK of the clock buffer is input to the data block via the data strobe driver 32, and thus the moving path of the signals is long, and it takes much more time for the internal clock signal BCK to be input to the data block. Accordingly, it is more difficult to secure the data setup/hold time margins in the semiconductor device shown in FIG. 3.

FIG. 4 is a timing diagram for explaining the operation of FIG. 3. Referring to FIG. 4, the problems can be more obviously confirmed.

FIG. 4 confirms that when the semiconductor device shown in FIG. 3 is operated in a test mode, the setup/hold time window characteristics are different from that of the semiconductor memory device when it is operated normally. In FIG. 4, the test mode TM is enabled at a high level turning off the data strobe buffer 30 and the data strobe driver 32. The pulse signals DQSRP and DQSFP are synchronized with the rising edge and falling edge of the internal clock signal BLCK respectively. FIG. 4 shows that the pulse signals DQSRP and DQSFP are delayed more than the input data DIN (which is delayed by the data delay unit 36).

If the amount of delay delayed by the data delay unit 36 is increased so that the setup time conforms to the hold time when the semiconductor device is in the test mode, problems occur when the semiconductor device operates in a non-test mode (i.e., normal mode). In the normal mode, the data strobe buffer 30 and the data strobe driver 32 are operated normally; and therefore, the amount of delay cannot be increased based on the problems incurred when the semiconductor device is in the test mode.

SUMMARY OF THE INVENTION

The present invention provides a data input apparatus in a semiconductor memory device capable of improving a setup/hold time window in a test mode.

Additionally, the present invention provides a data input apparatus capable of improving productivity by reducing the number of pins required in test equipment when testing a semiconductor memory device.

Additionally, the present invention provides a data input apparatus capable of increasing signal transmission efficiency and improving a data setup/hold time window since the output signal of the clock buffer in the present invention is not passed through a data strobe driver when the semiconductor device is in a test mode.

Additionally, the present invention controls the degree of delaying of data inputted from the external by a test mode signal.

To achieve these objects, a data input apparatus according to the present invention comprises: a data delay unit delaying and outputting data inputted from outside the data input apparatus, wherein the degree of delay differs according to a test mode signal; a data alignment signal generating unit receiving a first signal synchronized with an external clock signal and receiving a second signal synchronized with a data strobe signal to output any one of the first signal and the second signal as a data alignment signal in response to the test mode signal; and a data alignment unit synchronized with the data alignment signal to align the data delayed in the data delay unit.

The data alignment signal generating unit outputs the data alignment signal synchronized with the first signal when the test mode signal is enabled and outputs the data alignment signal synchronized with the second signal when the test mode signal is disabled.

The data alignment signal generating unit comprises a rising data alignment signal output unit to output a rising data alignment signal synchronized with a rising edge of the first signal or a rising data alignment signal synchronized with a rising edge of the second signal and a falling data alignment signal output unit to output a falling data alignment signal synchronized with a falling edge of the first signal or a falling data alignment signal synchronized with a falling edge of the second signal in response to the test mode signal.

The second signal comprises a rising data strobe pulse synchronized with the rising edge of the data strobe signal and a falling data strobe pulse synchronized with the falling edge of the data strobe signal.

The rising data alignment signal output unit outputs the first signal when the test mode signal is enabled and outputs the rising data strobe pulse when the test mode signal is disabled.

The falling data alignment signal output unit outputs an inverted first signal when the test mode signal is enabled and outputs the falling data strobe pulse when the test mode signal is disabled.

The degree of delay delayed by the data delay unit is higher when the test mode signal is enabled than the degree of delay delayed by the delay unit when the test mode signal is disabled.

Preferably, the data delay unit is arranged adjacent to the data alignment unit when the signal selection unit is disposed in the data input apparatus.

Also, a data input apparatus according to the present invention comprises a data strobe buffer unit receiving and buffering a data strobe signal in response to a test mode signal to output a rising data strobe signal and a falling data strobe signal; a data delay unit delaying and outputting data inputted from outside the data input apparatus, wherein the degree of delay differs according to the test mode signal; a clock buffer unit buffering an external clock signal to output an internal clock signal; a signal selection unit selecting one of the rising data strobe signal and the internal clock signal and selecting one of the falling data strobe signal and an inverted internal clock signal, the signals being selected in accordance with the test mode signal, and outputting the selected signals as a data alignment signal; and a data alignment unit synchronized with the data alignment signal to align input data outputted from the data delay unit.

The data strobe buffer unit comprises a buffer performing the buffering only when the test mode signal is disabled; and a data strobe driver driving the buffered data strobe signal and outputting the rising data strobe signal and the falling data strobe signal, wherein the data strobe driver drives the buffered data strobe signal such that the rising data strobe signal is synchronized with the rising edge of the buffered data strobe signal and the falling data strobe signal is synchronized with the falling edge of the buffered data strobe signal.

When the test mode signal is enabled, an input pin receiving the data strobe signal may be connected to a ground voltage or floated.

Preferably, the signal selection unit selects the internal clock signal and the inverted internal clock signal to be output as the data alignment signal when the test mode signal is enabled.

Preferably, the signal selection unit selects the rising data strobe signal and the falling data strobe signal to be output as the data alignment signal when the test mode signal is disabled.

The signal selection unit may comprises a rising data alignment signal output unit outputting one of the rising data strobe signal and the internal clock signal in response to the test mode signal; a the falling data alignment signal output unit outputting one of the falling data strobe signal and the inverted internal clock signal in response to the test mode signal.

The rising data alignment signal output unit may comprises a first transfer unit transferring the rising data strobe signal when the test mode signal is disabled and transferring the internal clock signal when the test mode signal is enabled.

The falling data alignment signal output unit may comprise a second transfer unit transferring the falling data strobe signal when the test mode signal is disabled and transferring the inverted internal clock signal when the test mode signal is enabled.

Preferably, the signal selection unit is arranged adjacent to the data alignment unit when the signal selection unit is disposed in the data input apparatus.

Preferably, the degree of delay that the data delay unit delays the signal outputted from the data input buffer is enough to secure setup and hold time window margins of the data when the test mode signal is enabled.

The data delay unit may include a third transfer unit that transfers the delayed data when the test mode signal is enabled.

Also, a data input apparatus according to the present invention comprises a buffer region comprising a data strobe buffer unit buffering a data strobe signal to output a strobe signal and a clock buffer unit buffering an external clock signal to output an internal clock signal; a signal selection region comprising a signal selection unit selecting any one of the strobe signal and the internal clock signal to apply the selected signal to a data block; and a data region comprising a data block buffering data inputted from outside the data input apparatus, the data block being synchronized with one of the strobe signal and the internal clock signal to align the data, wherein the buffer region, the signal selection region, and the data region are sequentially formed, and wherein the signal selection unit is arranged in the signal selection region such that the signal selection unit is between the data strobe buffer unit and the clock buffer unit.

The signal selection unit arranged between the clock buffer unit and the data block is adjacent to the data block, such that the data inputted from the clock buffer is inputted to the data block via the shortest path.

DESCRIPTION OF SPECIFIC EMBODIMENTS

The present invention discloses: a method capable of improving a data setup/hold time window by adding a delay unit, which is capable of controlling the degree data is delayed, for improving the data setup/hold time window upon entering into a test mode; and a circuit that is synchronized with a clock buffer upon entering into the test mode and that outputs a data alignment signal to the front of a data block.

Hereinafter, preferred embodiments of the present invention will be described with reference to the accompanying drawings.

Figure 1:
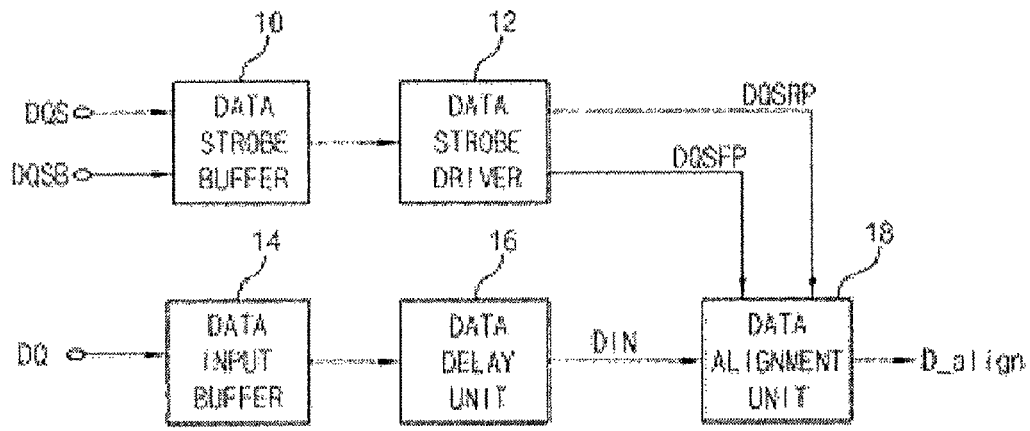
FIG. 1 is a block view of a prior art data input apparatus.
Figure 2:
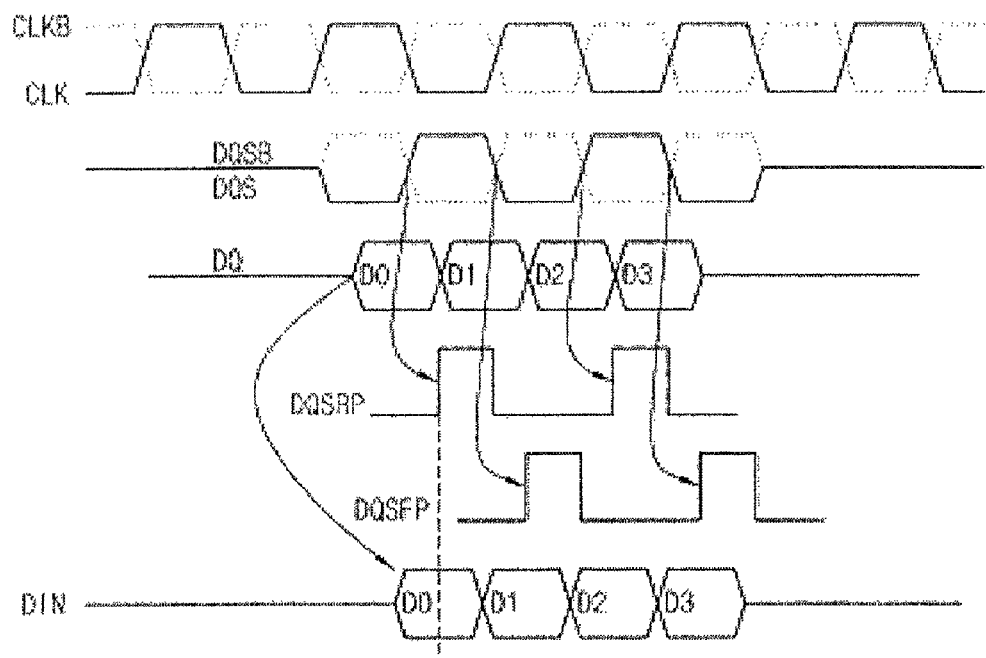
FIG. 2 is a timing diagram showing the operation of FIG. 1.
Figure 3:
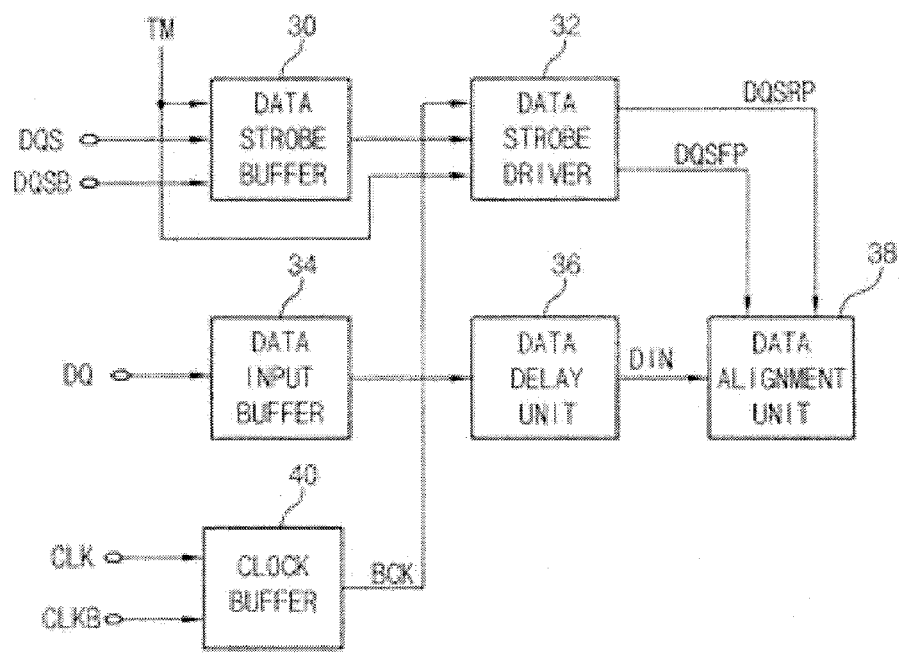
FIG. 3 is a block view of another prior art data input apparatus.
Figure 4:
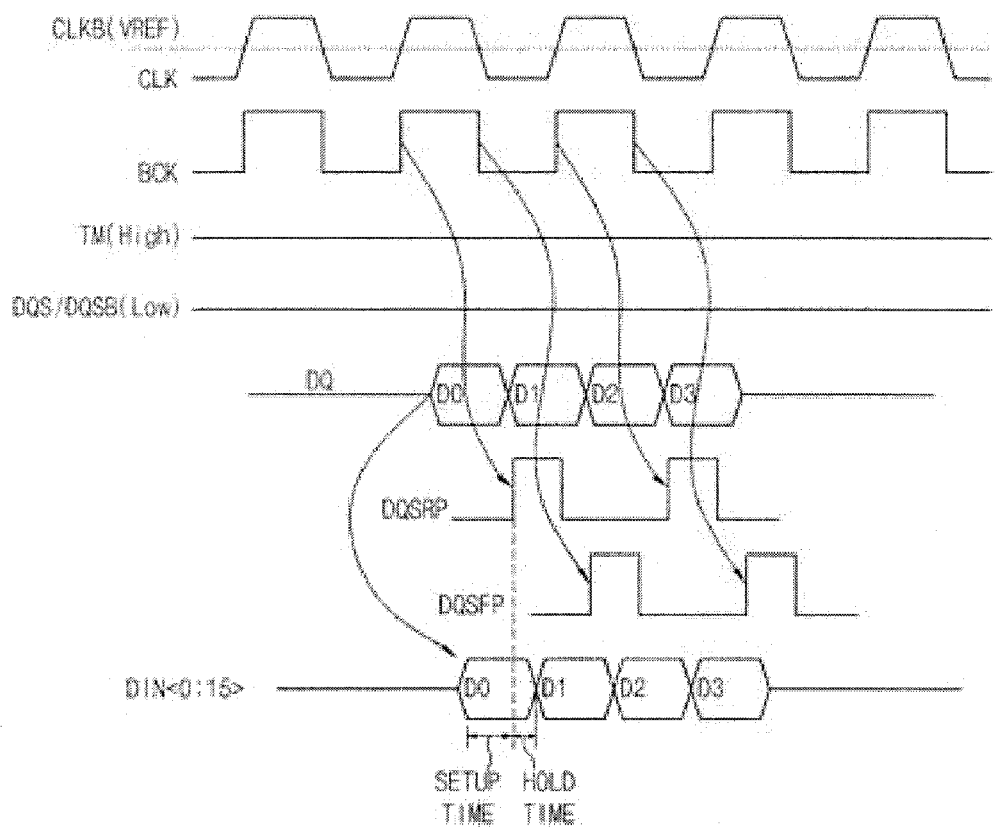
FIG. 4 is a timing diagram showing the operation of FIG. 3.
Figure 5:
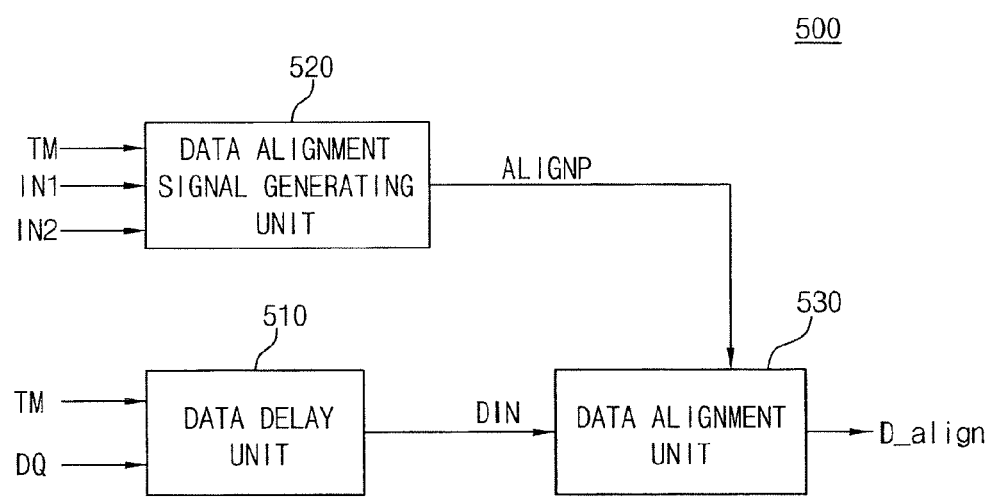
FIG. 5 is a block view of a data input apparatus according to one embodiment of the present invention.

FIG. 5 is a block view schematically showing a data input apparatus according to the present invention.

Referring to FIG. 5, the data input/output apparatus 500 comprises a data delay unit 510 delaying data DQ input from the external by a predetermined time in response to a test mode signal and outputting the delayed data; a data alignment signal generating unit 520 receiving two input signals IN1 and IN2 and outputting any one of the two input signals as a data alignment signal ALIGNP in response to the test mode signal; and a data alignment unit 530 that is synchronized with the data alignment signal ALIGNP to latch and align the data delayed in the data delay unit.

In FIG. 5, data DQ is delayed by the data delay unit 510 and is inputted to the data alignment unit 530. The data input to the data alignment unit 530 is represented by input data DIN.

The degree of delaying by which the data delay unit 510 delays is different according to whether the data input/output device is in a normal mode or a test mode. The reason is that the degree of delay required to secure the data setup/hold time margins is different depending on whether the device is in the normal mode or the test mode. It is preferable to determine the degree of delay in consideration of the signal characteristics of the first input signal IN1 and the second input signal IN2 that are input to the data alignment signal generating unit 520.

The first input signal IN1 may be a buffered internal clock signal synchronized with an external clock, and the second input signal IN2 may be a rising/falling data strobe signal synchronized with a data strobe signal. The rising data strobe signal is a signal synchronized with a rising edge of the data strobe signal, and the falling data strobe signal is a signal synchronized with a falling edge of the data strobe signal.

When the test mode signal TM is enabled, the semiconductor device enters into a test mode, and the first input signal IN1 is selected to be output as the data alignment signal ALIGNP. When the test mode signal TM is disabled, the semiconductor device operates in the normal mode, and the second input signal IN2 is selected to be output as the data alignment signal ALIGNP. In other words, when in the test mode, a data alignment signal ALIGNP synchronized with the external clock is generated; and when in the normal mode, a data alignment signal synchronized with the data strobe signal is generated.

The data alignment unit 530 aligns the input data DIN by means of the data alignment signal ALIGNP, and outputs the aligned input data DIN as the alignment data D_align.

Figure 6:
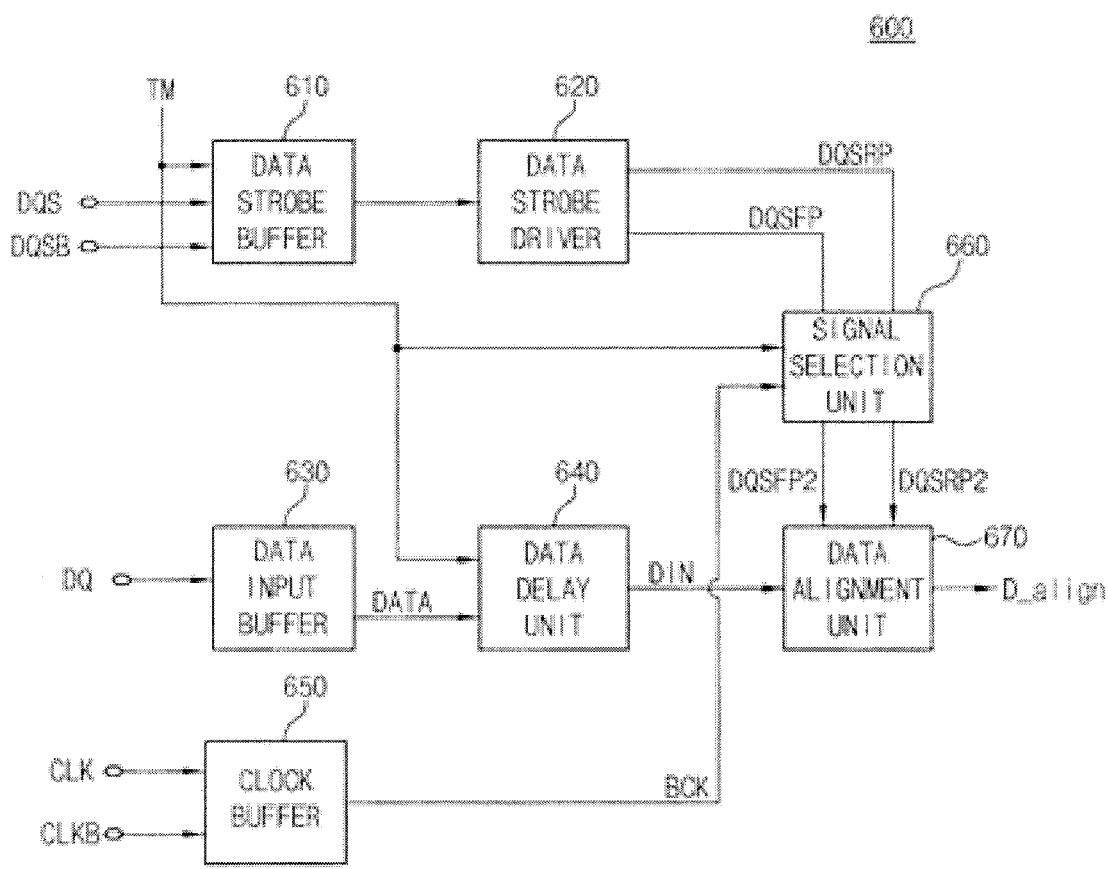
FIG. 6 is a block view of a data input apparatus according to another embodiment of the present invention.

FIG. 6 is a block view of a data input apparatus according to another embodiment of the present invention.

Referring to FIG. 6, the data input apparatus 600 includes a data strobe buffer 610, a data strobe driver 620, a data input buffer 630, a data delay unit 640, a clock buffer 650, a signal selection unit 660, and a data alignment unit 670.

The data strobe buffer 610 receives a data strobe signal pair DQS and DQSB and buffers the data strobe signal pair in response to the test mode signal TM. The data strobe buffer 610 performs normal buffering when the test mode signal TM is disabled, thus allowing the semiconductor device to be operated in the normal mode. The data strobe buffer 610 is turned-off when the test mode signal TM is enabled, thus allowing the semiconductor device to enter into the test mode. When the data strobe buffer 610 is turned off, the DQS pin and the DQSB pin for receiving the data strobe signal pair are connected to a ground voltage or floated so that they are processed as a Not Connect (NC) pin.

The data strobe driver 620 receives the buffering signal output from the data strobe buffer 610, and outputs a rising data strobe signal DQSRP and a falling data strobe signal DQSFP. When the test mode signal TM is enabled to turn-off the data strobe buffer 610, the data strobe driver 620 is also turned-off and does not output a pulse signal. The rising data strobe signal DQSRP is a signal synchronized with the rising edge of the data strobe signal DQS, and the falling data strobe signal is a signal synchronized with the falling edge of the data strobe signal DQS.

The data input buffer 630 receives data from the input terminal DQ to output buffering data DATA.

The data delay unit 640 delays data DATA (which is output from the data input buffer 630) for a predetermined time and outputs the delayed data as input data DIN to be input to the data alignment unit 670. The data delay unit 640 controls the setup/hold time characteristics, and controls the degree of delay according to whether the test mode signal TM is enabled.

Figure 7:
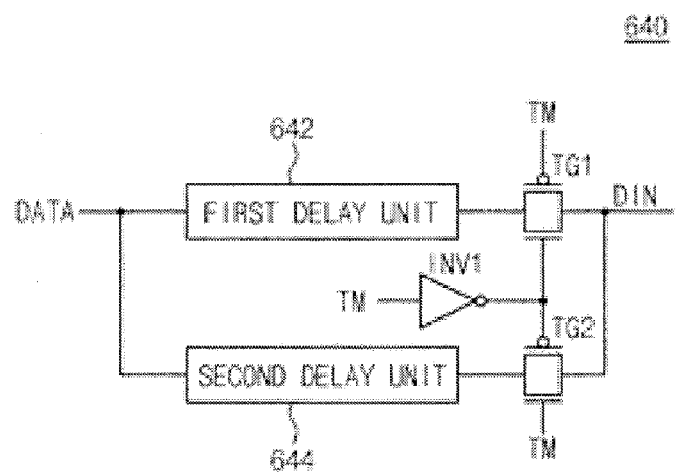
FIG. 7 is a detailed circuit diagram of the data delay unit of FIG. 6.

FIG. 7 is a detailed circuit diagram of the data delay unit.

Referring to FIG. 7, the data delay unit 640 comprises a first delay unit 642 and a second delay unit 644 for delaying a data signal DATA for a predetermined time, and a first transfer gate TG1 and a second transfer gate TG2 selectively transferring an output of the first delay unit 642 and an output of the second delay unit 644. The data delay unit also comprises an inverter INV1 inverting the test mode signal. The inverted test mode signal is input to an NMOS gate of the first transfer gate TG1 and a PMOS gate of the second transfer gate TG2. When the test mode signal TM is enabled, the first transfer gate TG1 is turned-off and the second transfer gate TG2 is turned-on, so that the signal delayed through the second delay unit 644 is output as the input data DIN. Preferably, the amount of time delayed by the second delay unit 644 is larger than the amount of time delayed by the first delay unit 642.

Referring again to FIG. 6, the clock buffer 650 receives and buffers a clock pair CLK and CLKB input from the external to output an internal clock signal BCK. Preferably, the clock buffer 650 comprises a driver (not shown) driving the buffering signal prior to outputting the internal clock signal BCK.

The signal selection unit 660 receives: the rising/falling data strobe signals DQSRP and DQSFP, which are the output signals of the data strobe driver 620; and the internal clock signal BCK, which is the output signal of the clock buffer 650. The signal selection unit 660 selects the rising/falling data strobe signals DQSRP and DQSFP or the internal clock signal BCK in response to the test mode signal TM. The signal selected by the signal selection unit 660 is output as a rising data strobe signal DQSRP2 and a falling data strobe signal DQSFP2 for aligning the data in the data alignment unit 670. The rising/falling data strobe signals DQSRP2 and DQSFP2 perform the role of a synchronization signal for aligning the data in the data alignment unit 670; and therefore, they are referred to as data alignment signals in the present invention. A detailed configuration of the signal selection unit 660 is shown in FIG. 8.

Figure 8:
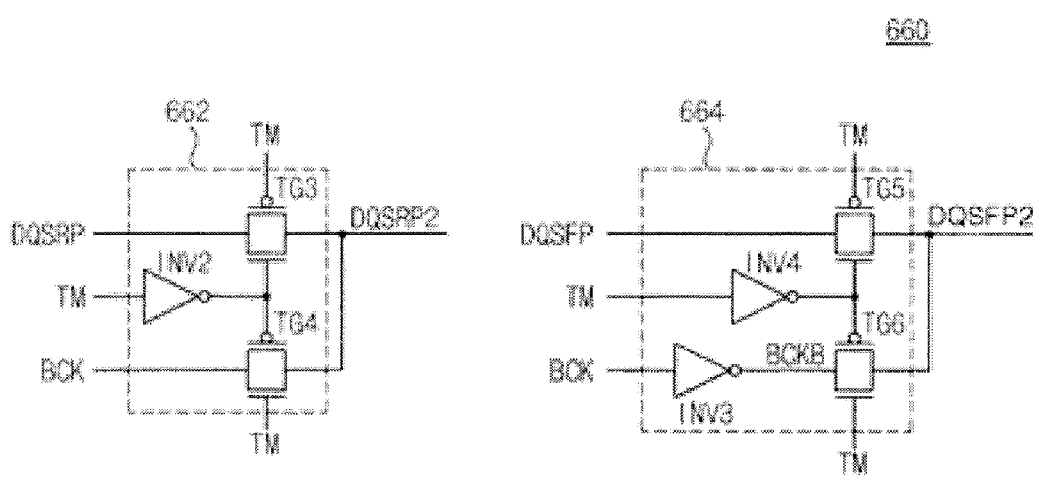
FIG. 8 is a detailed circuit diagram of the signal selection unit of FIG. 6.

Referring to FIG. 8, the signal selection unit 660 comprises a rising signal output unit 662 and a falling signal output unit 664. The rising signal output unit 662 is input with the rising data strobe signal DQSRP and the internal clock signal BCK and outputs the rising data strobe signal DQSRP2. The falling signal output unit 664 is input with the falling data strobe signal DQSFP and the internal clock signal BCK and outputs the falling data strobe signal DQSFP2.

The rising signal output unit 662 comprises a third transfer gate TG3 and a fourth transfer gate TG4. The third transfer gate TG3 is turned-on when the test mode signal TM is disabled to transfer the rising data strobe signal DQSRP as the rising data strobe signal DQSRP2. The fourth transfer gate is turned-on when the test mode signal TM is enabled to transfer the internal clock signal BCK as the rising data strobe signal DQSRP2. The rising signal output unit 662 also comprises an inverter INV2 for inverting the phase of the test mode signal TM. The inverted test mode signal TM is input to a common gate of the third and fourth transfer gates TG3, TG4.

Likewise, the falling signal output unit 664 comprises a fifth transfer gate TG5 transferring the falling data strobe signal DQSFP and a sixth transfer gate TG6 transferring the inverted internal clock signal BCKB by being turned-on or turned-off according to the state of the test mode signal TM. The falling signal output unit 664 also comprises an inverters INV3, INV4. The inverter INV3 inverts the phase of the internal clock signal BCK, and the inverted internal clock signal is supplied to the sixth transfer gate TG6. The inverter INV4 inverts the phase of the test mode signal TM, and the inverted test mode signal TM is supplied to a common gate of the fifth and sixth transfer gates TG5, TG6.

When operated in the normal mode the rising/falling data strobes DQSRP and DQSFP (which are output from the data strobe driver 620) are output as the data alignment signals DQSRP2 and DQSFP2. When operated in the test mode, the internal clock signal BCK (which is output from the internal clock buffer 650) is output as the data alignment signals DQSRP2 and DQSFP2.

Figure 9:
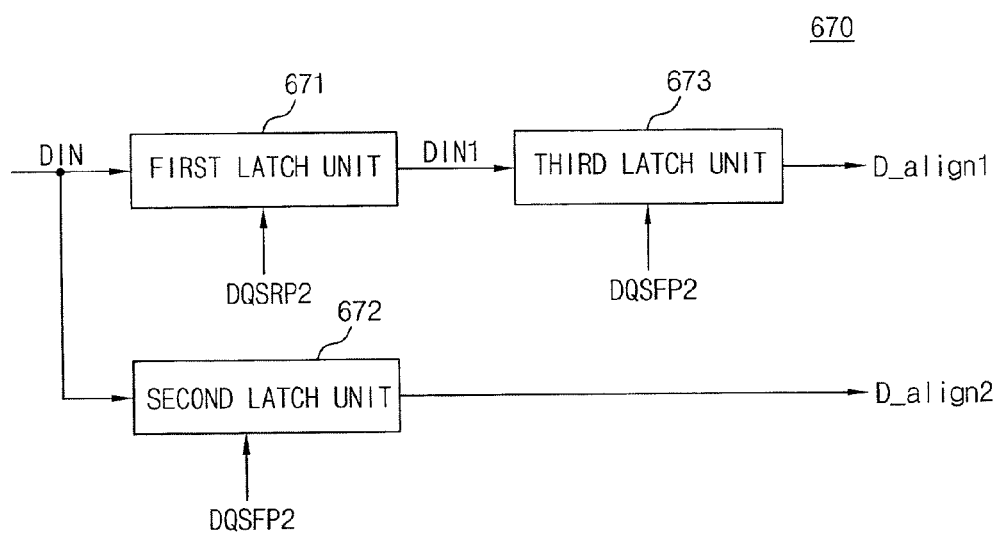
FIG. 9 is a block view of the data alignment unit of FIG. 6.

The data alignment unit 670 receives the input data DIN output from the data delay unit 640 to align and output the input data DIN in synchronization with the data alignment signals DQSRP2 and DQSFP2. FIG. 9 is a detailed circuit of the data alignment unit 670.

Referring to FIG. 9, the data alignment unit 670 comprises first to third latch circuits 671, 672, 673. The first latch circuit 671 latches a first data D0 of the input data DIN (which is output from the data delay unit 640) in response to the rising data strobe signal DQSRP2, and transfers the latched data DIN1 to the third latch circuit 673. The second latch circuit 672 latches a second data D1 of the input data DIN in response to the falling data strobe signal DQSFP2. The third latch circuit 673 latches and outputs the DIN1 in response to the falling data strobe signal DQSFP2 simultaneously with the operation of the second latch circuit. With the configuration described above, both the first data D0 and the second data D1 of the input data DIN are aligned in synchronization with the falling data strobe signal DQSFP2.

Figure 10:
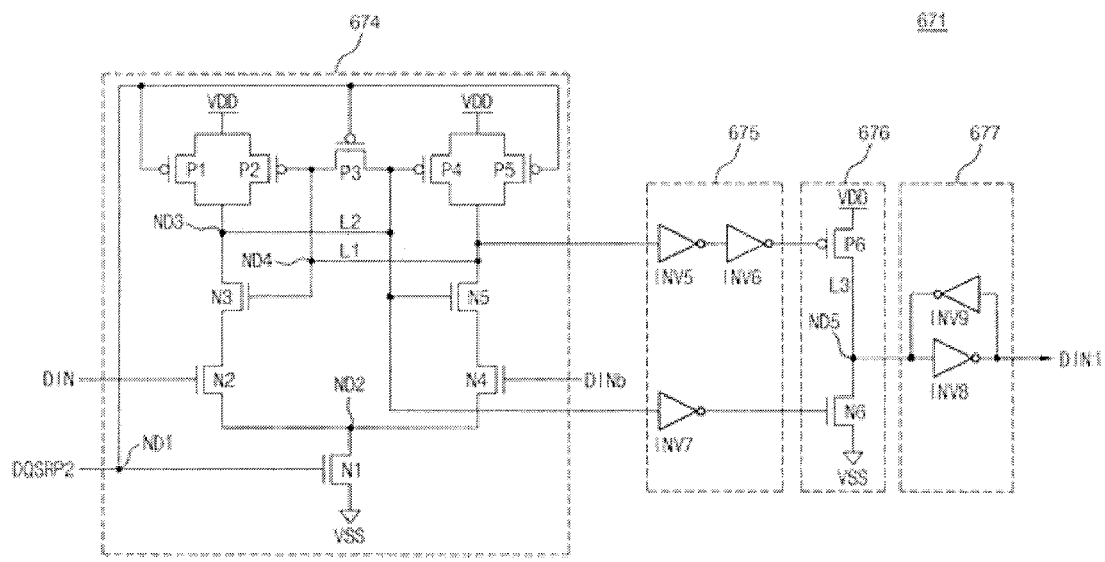
FIG. 10 is a detailed circuit diagram of the first latch unit of FIG. 9.

FIG. 10 shows a detailed circuit configuration of the first latch circuit 671. The configurations of the second latch circuit 672 and third latch circuit 673 are substantially the same as the first latch circuit 671; and therefore, only the first latch circuit will be described.

Referring to FIG. 10, the first latch circuit 671 comprises a differential amplifier 674, a buffer unit 675, an output driver 676, and a latch unit 677.

The differential amplifier 674 comprises a plurality of PMOS transistors P1 to P5 and a plurality of NMOS transistors N1 to N5. The NMOS transistor N1 is turned-on in response to the rising data strobe signal DQSRP2, allowing a ground voltage VSS to be applied to node ND2. The NMOS transistor N2 responds to the input signal DIN and the NMOS transistor N3 responds to a logic signal L1 to connect the node ND2 and a node ND3.

The PMOS transistors P1 and P2 respond to the rising data strobe signal DQSRP2 and the logic signal L1 to form a current mirror applying the power supply voltage VDD to the node ND3. The PMOS transistor P3 responds to the rising data strobe signal DQSRP2 to connect the node ND3 and the node ND4. The NMOS transistors N4 and N5 respond to an inverted input signal DINb and a logic signal L2 to connect the node ND4 and the node ND2. The PMOS transistor P4 is turned-on in response to the logic signal L2 and the PMOS transistor P5 is turned-on in response to the rising data strobe signal DQSRP2. When the PMOS transistors P4 and P5 are turned-on, the power supply voltage VDD is applied to the node ND4.

The operation of the differential amplifier 674 will now be reviewed. When the rising data strobe signal DQSRP2 is a logic low level, each PMOS transistor P1 to P5 is turned-on and the power supply voltage VDD is applied to the nodes ND3 and ND4 so that the nodes ND3 and ND4 become a logic high level. If the rising data strobe signal DQSRP2 is enabled, i.e. a logic high, all the PMOS transistors P1 to P5 are turned-off so that the logic signals L1 and L2 maintain the logic high.

The NMOS transistors N2 and N4 operate in response to the input signals DIN and DINb. When the NMOS transistors N2 and N4 are turned-on, the logic signals L1 and L2 are output.

The output logic signals are buffered in the buffer unit 675 and are then applied to the output driver 676. The buffer unit 675 comprises a plurality of inverter INV5, INV6, INV7. The output driver 676 comprises a pull up driver P6 and a pull down driver N6. The data is applied to the node ND5 by means of the operations of the pull up driver P6 and the pull down driver N6. The latch unit 677 latches the data and outputs the data as the input signal DIN1. The latch unit 677 comprises a plurality of inverter INV8, INV9.

With the configuration as described above, the data input to the first latch unit 671 is transferred to the third latch unit 673 in response to the rising data strobe signal DQSRP2.

The second latch unit 672 and the third latch unit 673 have the same configuration as that of the first latch unit. The second latch unit 672 and the third latch unit 673 each latch the data in response to the falling data strobe signal. Therefore, the data input through a DQ pad is aligned and output by means of the falling data strobe signal.

Figure 11:
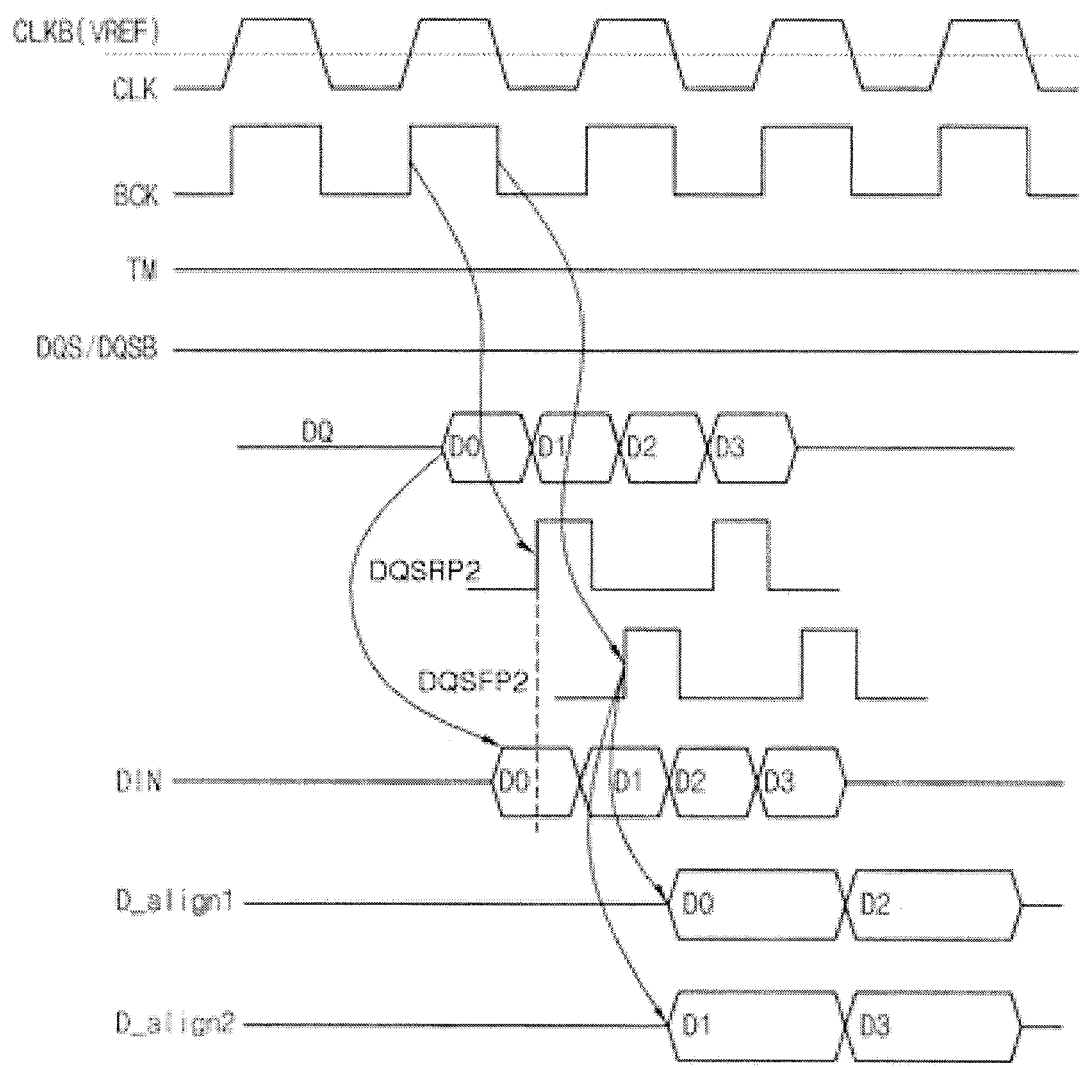
FIG. 11 is a timing diagram showing the operation of the data input apparatus of FIG. 6.

FIG. 11 shows an operation timing diagram for the data input apparatus shown in FIG. 6.

Referring to FIG. 11, when the test mode signal TM is enabled, i.e., is a high level, the test mode signal TM is synchronized with the rising edge and falling edge of the internal clock signal BCK to generate the data strobe signals DQSRP2 and DQSFP2. At this time, the data strobe signal pair DQS and DQSB are a ground level or are being floated to maintain a high impedance (Hi-z) state.

The data D0, D1, D2, and D3, which is input through the DQ pad, is delayed properly by the data delay unit 640. The data delay unit 640 outputs the data as the input data DIN such that the setup and hold window margins are properly secured. It can be confirmed when referring to FIG. 11 that the rising edges of the rising data strobe pulse DQSRP2 and the falling data strobe pulse DQSFP2 are positioned at the center of the windows of the input data DIN. Accordingly, the data input apparatus has an improved hold time as compared to the prior art.

The first data D0 of the input data DIN is latched by means of the rising data strobe signal DQSRP2 in the first latch unit 671 of the data alignment unit 670 shown in FIG. 9. The first data D0 is then latched by means of the falling data strobe signal DQSFP2 in the third latch unit 673 so that the first data D0 is output as a first alignment data D_align1. Next, the second data D1 of the input data DIN is latched by means of the falling data strobe signal DQSFP2 in the second latch unit 672 so that it is output as a second alignment data D_align2. Therefore, the data D0 and D2 and the data D1 and D3 are aligned as shown in FIG. 11.

Figure 12:
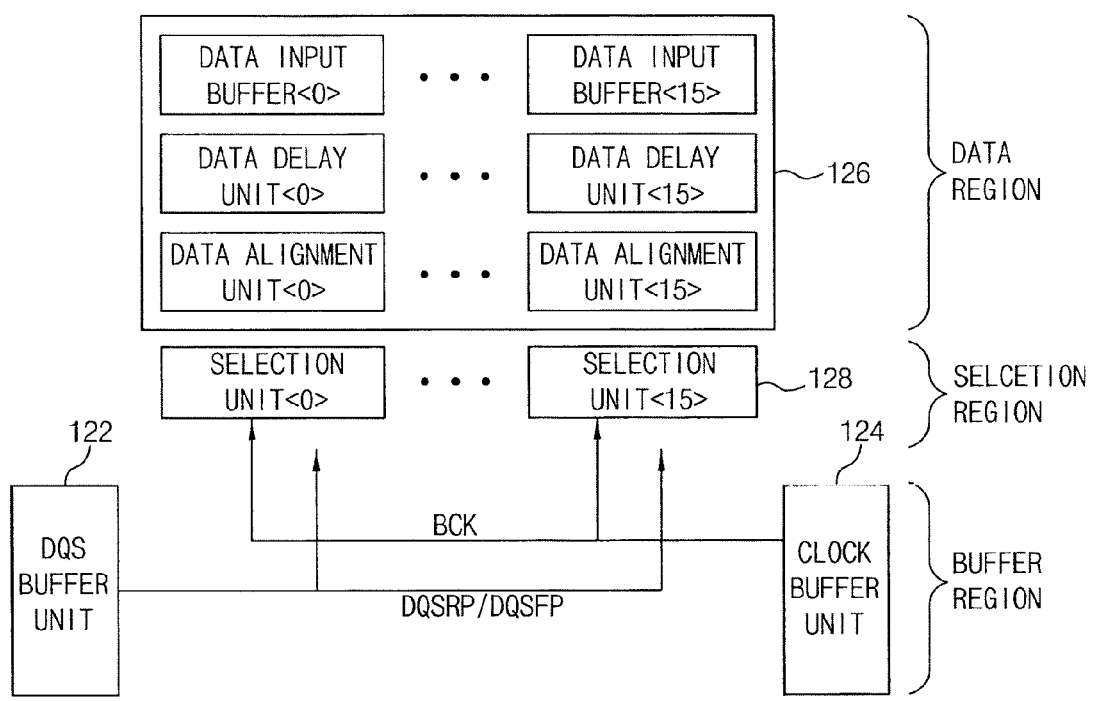
FIG. 12 is a block view showing the positioning of the signal selection unit of FIG. 6. as arranged in the data input apparatus.

FIG. 12 shows the positioning of the signal selection unit of FIG. 6 as arranged in the data input apparatus.

Referring to FIG. 12, a buffer region, a selection region, and a data region are sequentially formed. The data strobe buffer unit 122 and the clock buffer unit 124 are provided at sides of the buffer region. A signal selection unit 128 and a data block 126 are provided at a center location with respect to the data strobe buffer unit 122 and the clock buffer unit provided in the buffer region. The data block 126 comprises a data input buffer, a data delay unit, and a data alignment unit as described above. In the case of X16, there are 16 data input buffers and data alignment units as is shown in FIG. 12.

The signal selection unit 128 is arranged between the data region and the buffer region so as to minimize the moving path of signals; and preferably, the signal selection unit 128 is arranged to be adjacent to the data block 126.

In contrast, if the signal selection unit 128 were to be arranged in the data strobe buffer unit, the moving path of signals would be long. This is because the internal clock signal BCK that is output from the clock buffer would be input to the data alignment unit of the data block 126 via the data strobe buffer unit 122 when in the test mode. As described above, the arrangement shown in FIG. 12 solves such a problem.

As described above, in the present invention, a data input apparatus capable of improving the setup/hold window when the semiconductor memory device is in the test mode is provided Additionally, in the present invention, when the semiconductor memory device is tested, the number of pins required in the test equipment is reduced, thus making it possible to improve productivity.

Additionally, in the present invention, a unit which outputs the data alignment signal in synchronization with the clock buffer signal when the test mode is enabled is added to the data input apparatus; and therefore, the output signal of the clock buffer does not pass through the data strobe driver even when in the test mode. Accordingly, it possible to increase the transmission efficiency and improve the setup and hold time window.

Additionally, in the present invention the degree of delay of the data input from the outside is controlled according to whether the device is in the test mode or the normal mode, making it possible to improve the data setup and the hold time window.

What is claimed is:

1. A data input apparatus comprising:
 a data delay unit delaying and outputting data inputted from outside the data input apparatus, wherein a degree of delay differs according to a test mode signal;
 a data alignment signal generating unit receiving a first signal synchronized with an external clock signal and receiving a second signal synchronized with a data strobe signal to output one of the first signal and the second signal as a data alignment signal in response to the test mode signal; and
 a data alignment unit synchronized with the data alignment signal to align the data delayed in the data delay unit.

2. The data input apparatus of claim 1, wherein the data alignment signal generating unit outputs the data alignment signal synchronized with the first signal when the test mode signal is enabled and outputs the data alignment signal synchronized with the second signal when the test mode signal is disabled.

3. The data input apparatus of claim 1, wherein the data alignment signal generating unit comprises:
 a rising data alignment signal output unit to output a rising data alignment signal synchronized with a rising edge of the first signal or a rising data alignment signal synchronized with a rising edge of the second signal; and a falling data alignment signal output unit to output a falling data alignment signal synchronized with a falling edge of the first signal or a falling data alignment signal synchronized with a falling edge of the second signal in response to the test mode signal.

4. The data input apparatus of claim 3, wherein the second signal comprises:
a rising data strobe pulse synchronized with a rising edge of the data strobe signal and a falling data strobe pulse synchronized with a falling edge of the data strobe signal.

5. The data input apparatus of claim 4, wherein the rising data alignment signal output unit outputs the first signal when the test mode signal is enabled, and outputs the rising data strobe pulse when the test mode signal is disabled.

6. The data input apparatus of claim 4, wherein the falling data alignment signal output unit outputs an inverted first signal when the test mode signal is enabled and outputs the falling data strobe pulse when the test mode signal is disabled.

7. The data input apparatus of claim 1, wherein a degree of delay delayed by the data delay unit is higher when the test mode signal is enabled than a degree of delay delayed by the delay unit when the test mode signal is disabled.

8. The data input apparatus of claim 1, wherein the data delay unit is arranged adjacent to the data alignment unit when the signal selection unit is disposed in the data input apparatus.

9. A data input apparatus comprising:
a data strobe buffer unit receiving and buffering a data strobe signal in response to a test mode signal to output a rising data strobe signal and a falling data strobe signal;
a data delay unit delaying and outputting data inputted from outside the data input apparatus, wherein a degree of delay differs according to the test mode signal;
a clock buffer unit buffering an external clock signal to output an internal clock signal;
a signal selection unit selecting one of the rising data strobe signal and the internal clock signal in accordance with the test mode signal, and selecting one of the falling data strobe signal and an inverted internal clock signal in accordance with the test mode signal, and outputting selected signals as a data alignment signal; and
a data alignment unit synchronized with the data alignment signal to align the data outputted from the data delay unit.

10. The data input apparatus of claim 9, wherein the data strobe buffer unit comprises:
a buffer performing the buffering only when the test mode signal is disabled; and
a data strobe driver driving the buffered data strobe signal and outputting the rising data strobe signal and the falling data strobe signal, wherein the data strobe driver drives the buffered data strobe signal such that the rising data strobe signal is synchronized with a rising edge of the buffered data strobe signal and a falling data strobe signal is synchronized with the falling edge of the buffered data strobe signal.

11. The data input apparatus of claim 9, wherein the signal selection unit selects the internal clock signal and the inverted internal clock signal to be output as the data alignment signal when the test mode signal is enabled.

12. The data input apparatus of claim 9, wherein the signal selection unit selects the rising data strobe signal and the falling data strobe signal to be output as the data alignment signal when the test mode signal is disabled.

13. The data input apparatus of claim 9, wherein the signal selection unit comprises:
a rising data alignment signal output unit outputting the one of the rising data strobe signal and the internal clock signal in response to the test mode signal; and
a falling data alignment signal output unit outputting the one of the falling data strobe signal and the inverted internal clock signal in response to the test mode signal.

14. The data input apparatus of claim 13, wherein the rising data alignment signal output unit comprises a first transfer unit transferring the rising data strobe signal when the test mode signal is disabled and transferring the internal clock signal when the test mode signal is enabled.

15. The data input apparatus of claim 13, wherein the falling data alignment signal output unit comprises a second transfer unit transferring the falling data strobe signal when the test mode signal is disabled and transferring the inverted internal clock signal when the test mode signal is enabled.

16. The data input apparatus of claim 9, wherein the signal selection unit is arranged adjacent to the data alignment unit when the signal selection unit is disposed in the data input apparatus.

17. The data input apparatus of claim 9, wherein the degree of delay that the data delay unit delays a signal output from a data input buffer is enough to secure setup and hold time window margins of the data when the test mode signal is enabled.

18. The data input apparatus of claim 9, wherein the data delay unit includes a transfer unit that transfers the delayed data when the test mode signal is enabled.

* * * * *